United States Patent
Kim et al.

(10) Patent No.: US 6,486,016 B2
(45) Date of Patent: Nov. 26, 2002

(54) METHOD FOR FORMING SELF ALIGNED CONTACTS

(75) Inventors: Jong-sam Kim, Seoul (KR); Il-wook Kim, Seoul (KR); Dong-kuk Lee, Icheon-shi (KR); Phil-goo Kong, Suwon-shi (KR)

(73) Assignee: Hynix Semiconductor, Inc., Gyunggi-do (KR)

( * ) Notice: Subject to any disclaimer, the term of this patent is extended or adjusted under 35 U.S.C. 154(b) by 0 days.

(21) Appl. No.: 09/941,199

(22) Filed: Aug. 27, 2001

(65) Prior Publication Data

US 2002/0098640 A1 Jul. 25, 2002

(30) Foreign Application Priority Data

Sep. 4, 2000 (KR) ............................................. 00-52163

(51) Int. Cl.[7] ............................................. H01L 27/148
(52) U.S. Cl. ...................... 438/229; 438/233; 438/239; 438/241; 438/618; 438/585; 438/264
(58) Field of Search .................. 438/239, 241, 438/250, 311, 229, 585, 586, 618, 592

(56) References Cited

U.S. PATENT DOCUMENTS

| | | | |
|---|---|---|---|
| 5,019,525 A | | 5/1991 | Virkus et al. |
| 5,104,822 A | | 4/1992 | Butler |
| 5,631,179 A | * | 5/1997 | Sung et al. ................. 438/264 |
| 6,015,730 A | | 1/2000 | Wang et al. |
| 6,165,880 A | * | 12/2000 | Yaung et al. ............... 438/592 |
| 6,335,285 B1 | * | 1/2002 | Chun et al. ................. 438/692 |
| 6,350,665 B1 | * | 2/2002 | Jin et al. .................... 438/585 |

* cited by examiner

Primary Examiner—David Nelms
Assistant Examiner—Thao P Le
(74) Attorney, Agent, or Firm—Marshall, Gerstein & Borun

(57) ABSTRACT

A method for forming a self aligned contact of a semiconductor device, comprises the steps of: forming a conductive line and a hard mask on a structure of a semiconductor substrate; forming spacers constructed by an insulation material on the sidewalls of the conductive line and the hard mask; forming an interlayer insulating layer on the resultant material and then etching the interlayer insulating layer at the contact part; forming an etching barrier layer on the surface of the substrate between the spacers; forming an uneven buffer layer on the resultant material, the uneven buffer deposited on the hard mask thickly and on the etching barrier layer thinly by using a material having a bad step coverage; and forming a self aligned contact by sequentially etching the uneven buffer layer and the etching barrier layer and then opening the surface of the substrate between the spacers. Since the hard mask of the line part is protected by the uneven buffer layer deposited thickly, the insulating characteristic between the line and the contact is enhanced.

8 Claims, 3 Drawing Sheets

METHOD FOR FORMING SELF ALIGNED CONTACTS

BACKGROUND

1. Technical Field

A method for forming a self aligned contact, and in particular, a method for forming a self aligned contact which can make an electrical insulation margin increase between a conductive pattern and a contact when fabricating a fine contact of a high integration semiconductor.

2. Description of the Background Art

High integration of semiconductor devices has necessitated studies on new materials for lithography, cell structure and wiring, as well as on the limitation of a property of matter related to the insulation layer. Moreover, as the cell area is being reduced due to high integration of semiconductor devices, it is also inevitable to reduce the contact hole area.

Misalignment of a mask frequently exposes a peripheral structure such as a gate electrode or a bit line, which causes contact to be made between a gate electrode and a storage electrode, and a bit line and a storage electrode, respectively, thus resulting in low reliability of the memory device.

Hence, studies have been made to develop methods of achieving minimization of a contact hole without having to expose peripheral structure due to misalignment of a mask, among which is a Self Aligned Contact Method.

In the said Self Aligned Contact Method, only the contact area can be opened by controlling the amount of etching by using the prominence and depression of the semiconductor substrate. Since this method is capable of obtaining a contact of various sizes depending on the height of the peripheral structure, thickness of the insulation material on which a contact is to be formed, and the etching method, it is useful for fabricating semiconductor devices which are being minimized due to high integration.

For example, the execution of the Self Aligned Contact Method on a substrate on which the word line and bit line is formed will be described as follows.

FIGS. 1a to 1c are views illustrating processes for explaining the self aligned contact method in accordance with the conventional art.

As shown in FIG. 1a, the word line or the bit line is formed on the semiconductor substrate 10 having a predetermined lower structure. At this time, a doped polysilicon layer 12 and a tungsten layer 14 construct the word line or the bit line. A hard mask 16 is formed on the tungsten layer 14 and a spacer 18 made of insulating materials is formed on the sidewall of the tungsten layer 14. An etch barrier layer 11 is formed on the surface of the substrate, between the spacers. An oxide thin layer 20 and an inter-layer insulating layer (not shown) are formed on the entire surface of the substrate.

Thereafter, as shown in FIG. 1b, the interlayer insulating layer and the oxide thin layer between the spacers 18 are etched by executing a photolithography process using the self aligned contact mask.

Thereafter, as shown in FIG. 1c, the etch barrier layer 11 between the spacers 18 is removed and then the self aligned contact is formed, thereby exposing the surface of the substrate.

On the other hand, as the degree of integration of semiconductor processes become higher, the design rule of the devices is being reduced, a fabricating method for exposing the substrate by using a mask of T-type or bar-type is used in a contact fabricating process in order to obtain a sufficient space. In order to use such an etching technology, in the contact fabricating method, an electrical insulation between the line and the contact must be achieved by minimizing damage of the hard mask and the spacer surrounding the word line and the bit line.

When the device isolation region is exposed in an etching process for the self aligned contact, the leakage current characteristic become deteriorated and so generally the etch barrier layer is added before depositing the interlayer insulating layer. So, the etch barrier layer must be removed in order to open the active region of the substrate in the contact fabricating process.

However, when removing the etch barrier layer between the spacers, in case of executing an over etch, the over etch of the hard mask 16' and the spacer by which the word line or the bit line are surrounded occurs and so an interlayer insulation characteristic become deteriorated.

So, if the thickness of the hard mask is increased, it is difficult to form a pattern of the word line and, thereafter, when filling a gap of the self aligned contact region, a void is generated.

In addition, when the oxidation material is used as an etch barrier layer and the nitride material is used as a hard mask and a spacer, in etching the oxide layer, since the gas for generating much polymer is combined in order to obtain high selectivity to the nitride layer, the bottom part of the spacer is etched incompletely, as a reference numeral F, so it is difficult to secure the contact area.

SUMMARY OF THE DISCLOSURE

Accordingly, a method for forming the self aligned contact is disclosed in which: an uneven buffer layer is thickly formed on the upper surface of the line and thinly formed on the substrate by depositing insulation material having a bad step coverage (i.e., good coverage between the steps but poor or negligible coverage of the sides and tops of the steps), and thereafter the uneven buffer layer is etched and the substrate is opened, so that since the hard mask of the line part is protected by the uneven buffer layer deposited thickly, damage caused by the etching process can be reduced, thereby enhancing the insulating characteristic between the line and the contact.

In order to achieve the above-described aspect of the disclosure, a method comprises: forming a conductive line and a hard mask on a structure of a semiconductor substrate; forming spacers constructed by an insulation material on the sidewalls of the conductive line and the hard mask; forming an interlayer insulating layer on the resultant material and then etching the interlayer insulating layer at the contact part; forming an etching barrier layer on the surface of the substrate between the spacers; forming an uneven buffer layer on the resultant material, the uneven buffer deposited thickly on the hard mask and thinly on the etching barrier layer by using a material having inconsistent coverage; and forming a self aligned contact by sequentially etching the uneven buffer layer and the etching barrier layer and then opening the surface of the substrate between the spacers.

BRIEF DESCRIPTION OF THE DRAWINGS

The disclosed method will become better understood with reference to the accompanying drawings, which are given only by way of illustration and thus are not limitative of the present invention, wherein.

DETAILED DESCRIPTION OF THE PRESENTLY PREFERRED EMBODIMENTS

A method for forming the self aligned contact in accordance with a preferred embodiment will now be described with reference to the accompanying drawings.

Figure 1A:
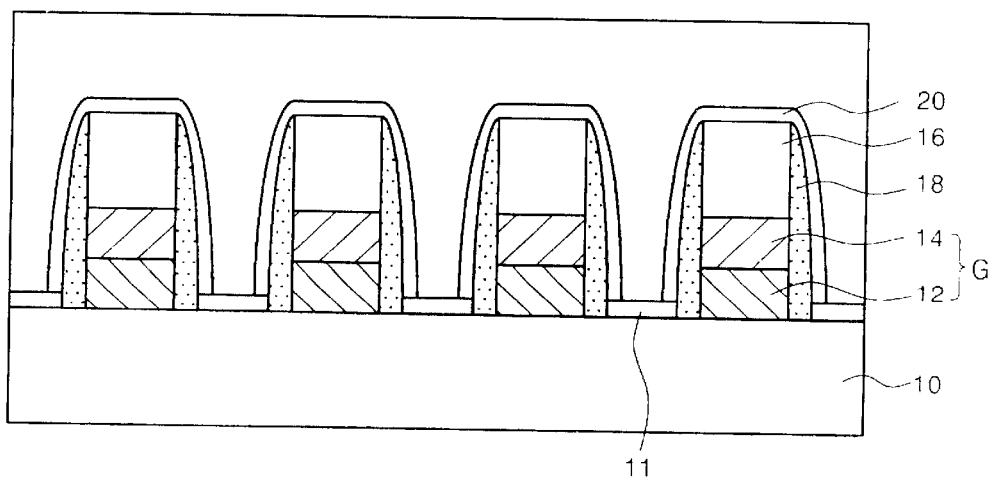
FIGS. 1a to 1c are views illustrating processes for explaining the self aligned contact method in accordance with the conventional art.
Figure 1B:
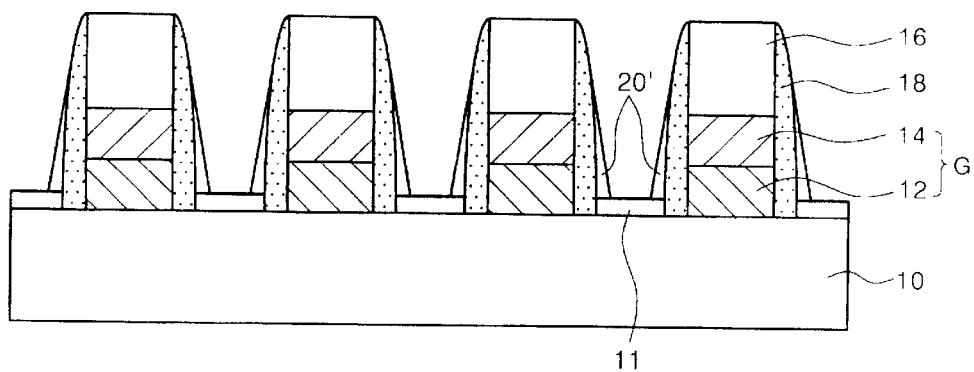
Figure 1C:
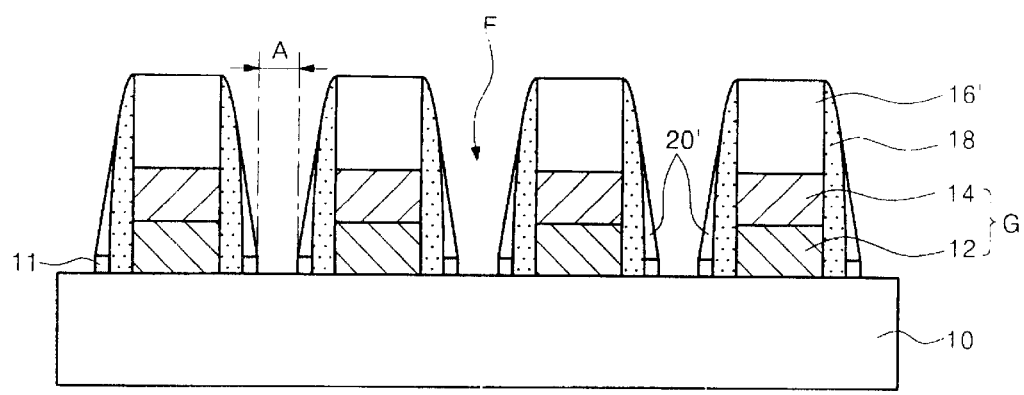
Figure 2A:
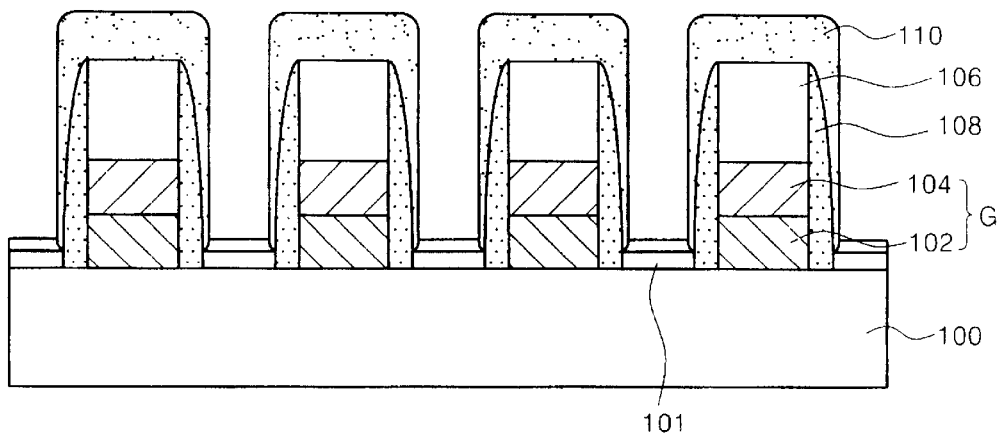
FIGS. 2a and 2b are views illustrating processes for explaining the self aligned contact method in accordance with the present invention.
Figure 2B:
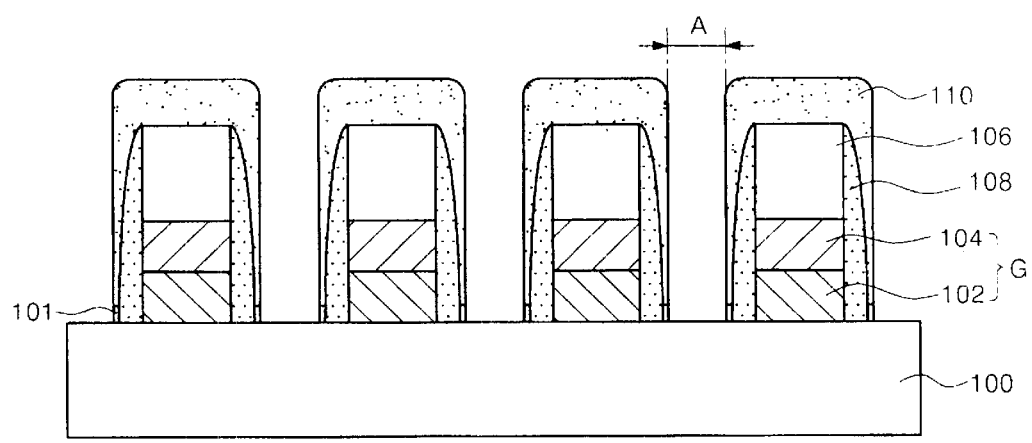

FIGS. 2a and 2b are views illustrating processes for explaining the self aligned contact method in accordance with the present invention.

As shown in FIG. 2a, the word line or the bit line G is formed on the surface of the semiconductor substrate 100 having a predetermined lower structure. The word line or the bit line G is constructed by a doped polysilicon layer 102 and tungsten layer 104. A hard mask layer 106 is formed on the tungsten layer 104 and a spacer 108 made of insulating material is formed on the sidewall of the tungsten layer 104. An etch barrier layer 101 is formed on the surface of the substrate between the spacers and an interlayer insulating layer (not shown) is formed on the entire surface of the substrate.

After etching the interlayer insulating layer on the contact part by the photolithography process using the contact mask, the residual of a circumference of the line or an oxidized substance of a sidewall of the line is removed by executing a cleaning process.

Thereafter, the etch barrier layer 101 is formed on the surface of the substrate between the spacers 108. At this time, preferably, a material having an etching selectivity to the insulation material having poor step coverage (i.e., negligible coverage on the top and sides of the spaces but significant coverage between the spacers is shown in FIG. 2a), preferably, a nitride material is used as the etching barrier layer 101.

Thereafter, an uneven buffer layer 110 is formed on the resultant material by using the material having a bad step coverage, that is, the even buffer layer 110 is deposited on the insulation layer thickly and the etching barrier layer thinly.

As shown in FIG. 2b, the uneven buffer layer 110 and the etching barrier layer 101 are etched sequentially by a blanket etching process and then the surface of the substrate between the spacers 108 is opened, thereby forming a self aligned contact.

According to the disclosed process, the loss of the insulation layer is minimized at a circumference of the word (or bit) line by the buffer layer 110 deposited unevenly when the etching process is executed for the self aligned contact.

As mentioned above, an uneven buffer layer is thickly formed on the upper surface of the line and thinly formed on the substrate by depositing insulation material having a bad step coverage, and thereafter the uneven buffer layer is etched and the substrate is opened, so that since the hard mask of the line part is protected by the uneven buffer layer deposited thickly, the insulating characteristic between the line and the contact is enhanced.

According to the disclosed process, the residual or an oxidized substance between the spacers are removed entirely by using a cleaning process after etching, thereby increasing the contact area of the semiconductor device.

As the disclosed processes and resultant devices may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed:

1. A method for forming a self aligned contact of a semiconductor device, comprising the steps of:

forming a conductive line and a hard mask having sidewalls on a structure of a semiconductor substrate;

forming spacers comprising an insulation material on the sidewalls of the conductive line and the hard mask;

forming an interlayer insulating layer on the resultant material and then etching the interlayer insulating layer;

forming an etching barrier layer on the surface of the substrate between the spacers;

forming an uneven buffer layer on the resultant material, the uneven buffer layer being deposited on the hard mask thickly and on the etching barrier layer thinly by using a material having a bad step coverage; and forming a self aligned contact by sequentially etching the uneven buffer layer and the etching barrier layer to open the surface of the substrate between the spacers.

2. The method for forming a self aligned contact according to claim 1, wherein a cleaning process is executed after etching the interlayer insulating layer.

3. The method for forming a self aligned contact according to claim 1, wherein the material having bad step coverage is selected from the group consisting of USG, PE-TEOS, LP-TEOS and PSG.

4. The method for forming a self aligned contact according to claim 1, wherein the etching barrier layer comprises a material having an etching selectivity to the insulation material having a bad step coverage.

5. A highly integrated semiconductor device comprising a self aligned contact made in accordance with the method of claim 1.

6. A highly integrated semiconductor device comprising a self aligned contact made in accordance with the method of claim 2.

7. A highly integrated semiconductor device comprising a self aligned contact made in accordance with the method of claim 3.

8. A highly integrated semiconductor device comprising a self aligned contact made in accordance with the method of claim 4.

* * * * *